(12) United States Patent
Lee et al.

(10) Patent No.: US 7,799,653 B2
(45) Date of Patent: Sep. 21, 2010

(54) METHOD FOR FORMING CAPACITOR IN DYNAMIC RANDOM ACCESS MEMORY

(75) Inventors: Heng-Yuan Lee, Tainan County (TW); Ching-Chiun Wang, Miaoli County (TW); Tai-Yuan Wu, Taipei (TW)

(73) Assignee: Industrial Technology Research Institute, Hsin-Chu (TW)

( * ) Notice: Subject to any disclaimer, the term of this patent is extended or adjusted under 35 U.S.C. 154(b) by 152 days.

(21) Appl. No.: 12/179,996

(22) Filed: Jul. 25, 2008

(65) Prior Publication Data

US 2009/0191685 A1 Jul. 30, 2009

(30) Foreign Application Priority Data

Jan. 25, 2008 (TW) .............................. 97102758 A

(51) Int. Cl.
*H01L 21/20* (2006.01)

(52) U.S. Cl. ...................... 438/381; 438/238; 438/672; 438/740; 257/E21.17; 257/E21.168; 257/E21.231; 257/E21.645; 257/E21.646; 257/E21.647

(58) Field of Classification Search ................ 438/238, 438/381, 637, 679, 680, 683, 684, 685, 672, 438/740; 257/E21.17, 168, 231, 645, 646, 257/647

See application file for complete search history.

(56) References Cited

U.S. PATENT DOCUMENTS 5,142,639 A * 8/1992 Kohyama et al. ........... 257/306
5,518,948 A * 5/1996 Walker ........................ 438/396
6,362,012 B1 * 3/2002 Chi et al. ........................ 438/3
6,559,493 B2 * 5/2003 Lee et al. ..................... 257/301
6,605,539 B2 * 8/2003 Lee et al. ..................... 438/693
6,646,323 B2 * 11/2003 Dirnecker et al. ............. 257/532
6,656,785 B2 12/2003 Chiang et al.

* cited by examiner

*Primary Examiner*—David Nhu
(74) *Attorney, Agent, or Firm*—WPAT., P.C.; Justin King

(57) ABSTRACT

A method for forming a capacitor in a dynamic random access memory, comprising steps of: providing a semiconductor substrate having at least a transistor, whereon an interlayer dielectric layer having at least a first plug is formed so that the first plug is connected to the drain of the transistor; depositing an etching stop layer on the first plug and the interlayer dielectric layer; depositing a first insulating layer on the etching stop layer; forming at least a second plug on the first insulating layer and the etching stop layer so that the second plug is connected to the first plug; depositing a second insulating layer on the first insulating layer and the second plug; forming at least a mold cavity in the second insulating layer so that the aperture of the mold cavity is larger than the diameter of the second plug and there is a deviation between the mold cavity and the second plug; removing the first insulating layer in the mold cavity until the etching stop layer; depositing a first electrode layer to cover the second insulating layer, a sidewall portion of the mold cavity, the second plug and the etching stop layer; removing the second insulating layer so that the first electrode layer forms a single open-ended cavity; and depositing a dielectric layer and a second electrode layer.

11 Claims, 5 Drawing Sheets

METHOD FOR FORMING CAPACITOR IN DYNAMIC RANDOM ACCESS MEMORY

CROSS REFERENCE TO RELATED PATENT APPLICATION

This patent application is based on Taiwan, R.O.C. patent application No. 097102758 filed on Jan. 25, 2008.

BACKGROUND OF THE INVENTION

1. Field of the Invention

The present invention generally relates to a method for forming a capacitor in a dynamic random access memory (DRAM) and, more particularly, to a method by deviating the embedded position of the capacitor so as to lengthen the distance between a sidewall portion of the mold cavity and a plug to further increase the mechanical strength of the capacitor and avoid short circuit.

2. Description of the Prior Art

With the rapid development in computer software, a larger memory capacity is required. Since semiconductor processing has reached beyond deep sub-microns, even nanometers, the size of a semiconductor chip becomes smaller. In the case where the semiconductor memory is necessary to have a smaller size with an increased capacity, a high-dielectric material is selected and the surface area of the capacitor is increased. In order to increase the surface area of the capacitor, the capacitor is designed to exhibit a high aspect ratio, which leading to unreliable mechanical strength at the joint at the bottom of the capacitor.

In FIG. 1, which is a cross-sectional diagram of a conventional dynamic random access memory disclosed in U.S. Pat. No. 6,656,785 filed by TSMC. In FIG. 1, an interlayer dielectric layer 11 is formed on a substrate 10 comprising at least a transistor (not shown). The substrate 10 comprises at least a plug 12. The plug 12 is imbedded in a bottom electrode 13 of the capacitor in the interlayer dielectric layer 11 to increase the mechanical strength of the capacitor. However, at the bottom of the capacitor, since the distance between the sidewall portion 14 of the mold cavity and the plug 12 is too short, the dielectric layer 15 and the top electrode 16 are not uniformly deposited at the bottom, leading to short circuit between the top electrode 16 and the bottom electrode 13 to fail a device.

In order to overcome the above mentioned problems, there is need in providing a capacitor in a DRAM by deviating the embedded position of the capacitor so as to lengthen the distance between a sidewall portion of the mold cavity and a plug to further increase the mechanical strength of the capacitor and avoid short circuit.

SUMMARY OF THE INVENTION

It is an object of the present invention to provide a capacitor in a DRAM by deviating the embedded position of the capacitor so as to lengthen the distance between a sidewall portion of the mold cavity and a plug to further increase the mechanical strength of the capacitor and avoid short circuit.

In order to achieve the foregoing object, the present invention provides a method for forming a capacitor in a dynamic random access memory, comprising steps of:

providing a semiconductor substrate having at least a transistor, whereon an interlayer dielectric layer having at least a first plug is formed so that the first plug is connected to the drain of the transistor;

depositing an etching stop layer on the first plug and the interlayer dielectric layer; depositing a first insulating layer on the etching stop layer;

forming at least a second plug on the first insulating layer and the etching stop layer so that the second plug is connected to the first plug;

depositing a second insulating layer on the first insulating layer and the second plug;

forming at least a mold cavity in the second insulating layer so that the aperture of the mold cavity is larger than the diameter of the second plug and there is a deviation between the mold cavity and the second plug;

removing the first insulating layer in the mold cavity until the etching stop layer;

depositing a first electrode layer to cover the second insulating layer, a sidewall portion of the mold cavity, the second plug and the etching stop layer;

removing the second insulating layer so that the first electrode layer forms a single open-ended cavity; and depositing a dielectric layer and a second electrode layer.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE PREFERRED EMBODIMENT

The present invention can be exemplified by the preferred embodiments as described hereinafter.

In the present invention, the embedded position of a capacitor in a DRAM is deviated so as to lengthen the distance between a sidewall portion of the mold cavity and a plug to further increase the mechanical strength of the capacitor and avoid short circuit.

Figure 1:
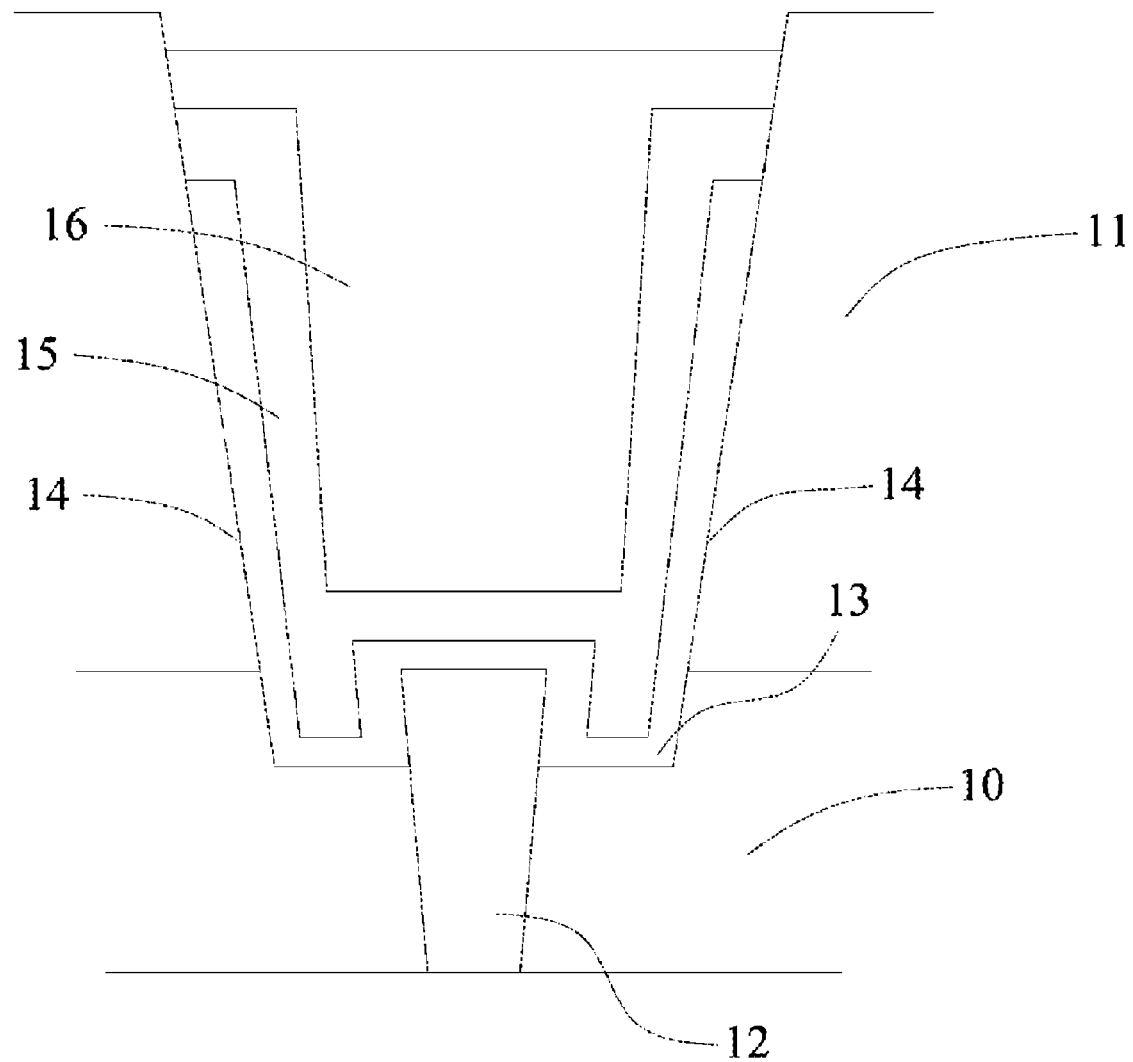
FIG. 1 is a cross-sectional diagram of a conventional dynamic random access memory.
Figure 2:
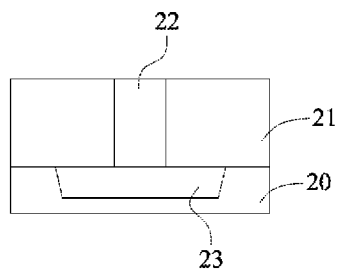
FIG. 2 is a cross-sectional diagram showing a first step of a method for forming a capacitor in a dynamic random access memory according to the present invention.

FIG. 2 to FIG. 11 are cross-sectional diagrams showing the first step to the tenth step of a method for forming a capacitor in a dynamic random access memory according to the present invention. First, FIG. 2 is a cross-sectional diagram showing a first step of a method for forming a capacitor in a dynamic random access memory according to the present invention. In FIG. 2, a semiconductor substrate 20 is provided to comprise at least a transistor (not shown). An interlayer dielectric layer 21 comprising at least a first plug 22 is formed on the semiconductor substrate 20 so that the first plug 22 is connected to the drain electrode 23 of the transistor. The technology of semiconductor processing for transistor manufacturing is well-known to those with ordinary skills in the art, and thus description thereof is not presented.

More particularly, after the interlayer dielectric layer 21 is formed, an aperture is formed in the interlayer dielectric layer 21 by photo-lithography and etching. A conductive material is deposited to fill in the aperture and then the conductive material is planarized to form the aperture 22. The conductive material is implemented by tungsten (W) or other conductive metal materials.

Figure 3:
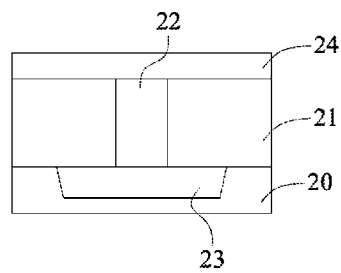
FIG. 3 is a cross-sectional diagram showing a second step of a method for forming a capacitor in a dynamic random access memory according to the present invention.
Figure 4:
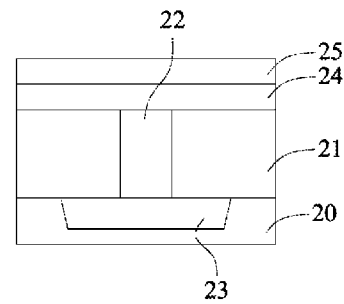
FIG. 4 is a cross-sectional diagram showing a third step of a method for forming a capacitor in a dynamic random access memory according to the present invention.

FIG. 3 is a cross-sectional diagram showing a second step of a method for forming a capacitor in a dynamic random access memory according to the present invention. In FIG. 3, an etching stop layer 24 is deposited on the first plug 22 and the interlayer dielectric layer 21. Then, a first insulating layer 25 is formed on the etching stop layer 24, as shown in FIG. 4.

Figure 5:
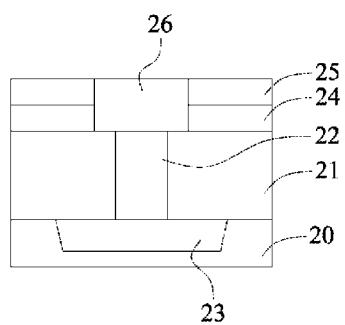
FIG. 5 is a cross-sectional diagram showing a fourth step of a method for forming a capacitor in a dynamic random access memory according to the present invention.

FIG. 5 is a cross-sectional diagram showing a fourth step of a method for forming a capacitor in a dynamic random access memory according to the present invention. In FIG. 5, at least a second plug 26 is formed on the first insulating layer 25 and the etching stop layer 24 so that the second plug 26 is connected to the first plug 22. More particularly, an aperture is formed in the first insulating layer 25 and the etching stop layer 24 by photo-lithography and etching. A conductive material is deposited to fill in the aperture and then the conductive material is planarized to form the second plug 26. The conductive material is implemented by tungsten (W) or other conductive metal materials.

Figure 6:
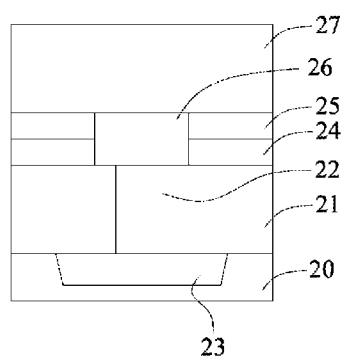
FIG. 6 is a cross-sectional diagram showing a fifth step of a method for forming a capacitor in a dynamic random access memory according to the present invention.
Figure 7:
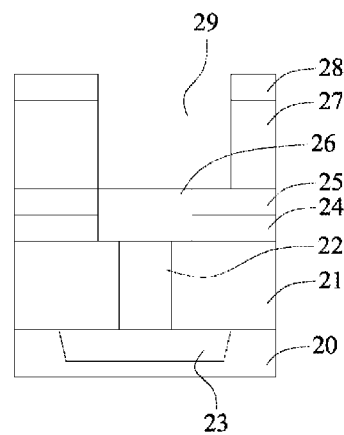
FIG. 7 is a cross-sectional diagram showing a sixth step of a method for forming a capacitor in a dynamic random access memory according to the present invention.

FIG. 6 is a cross-sectional diagram showing a fifth step of a method for forming a capacitor in a dynamic random access memory according to the present invention. In FIG. 6, a second insulating layer 27 is deposited on the first insulating layer 25 and the second plug 26. Then, after a photoresist layer 28 is deposited on the second insulating layer 27, photo-lithography and etching are used to form at least a mold cavity 29 in the second insulating layer 27 so that the aperture of the mold cavity 29 is larger than the diameter of the second plug 26 and there is a deviation between the mold cavity 29 and the second plug 26, as shown in FIG. 7. In FIG. 7, in order to overcome the problem in that the bottom of the capacitor is too small, the position of the second plug embedded in the capacitor is deviated such that the deviation is half of the width of the mold cavity 29.

Figure 8:
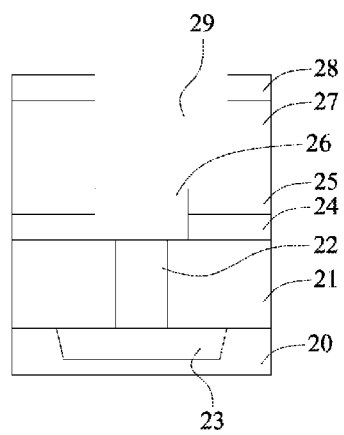
FIG. 8 is a cross-sectional diagram showing a seventh step of a method for forming a capacitor in a dynamic random access memory according to the present invention.
Figure 9:
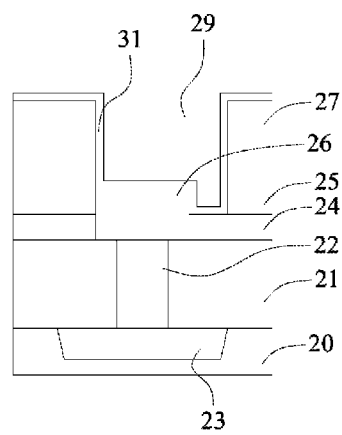
FIG. 9 is a cross-sectional diagram showing a eighth step of a method for forming a capacitor in a dynamic random access memory according to the present invention.
Figure 10:
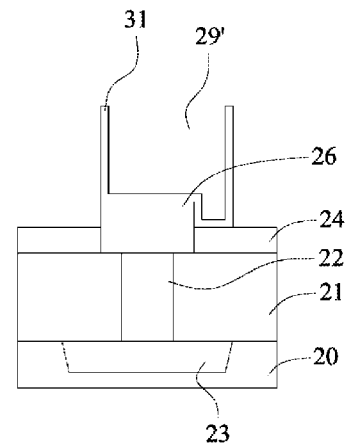
FIG. 10 is a cross-sectional diagram showing a ninth step of a method for forming a capacitor in a dynamic random access memory according to the present invention.

FIG. 8 is a cross-sectional diagram showing a sixth step of a method for forming a capacitor in a dynamic random access memory according to the present invention. In FIG. 8, the first insulating layer 25 in the mold cavity 29 is removed until the etching stop layer. Then, after the photoresist layer 28 is removed, a first electrode layer is deposited to cover the second insulating layer 27, a sidewall portion of the mold cavity 29, the second plug 26 and the etching stop layer 24, as shown in FIG. 9. The first electrode layer 31 is formed of high work function materials such as TiN, Ru, TaN, Si, Pt or combination thereof by physical vapor-phase deposition (PVD) or chemical vapor-phase deposition (CVD). Then, the second insulating layer 27 is removed so that the first electrode layer 31 forms a single open-ended cavity 29', as shown in FIG. 10.

Figure 11:
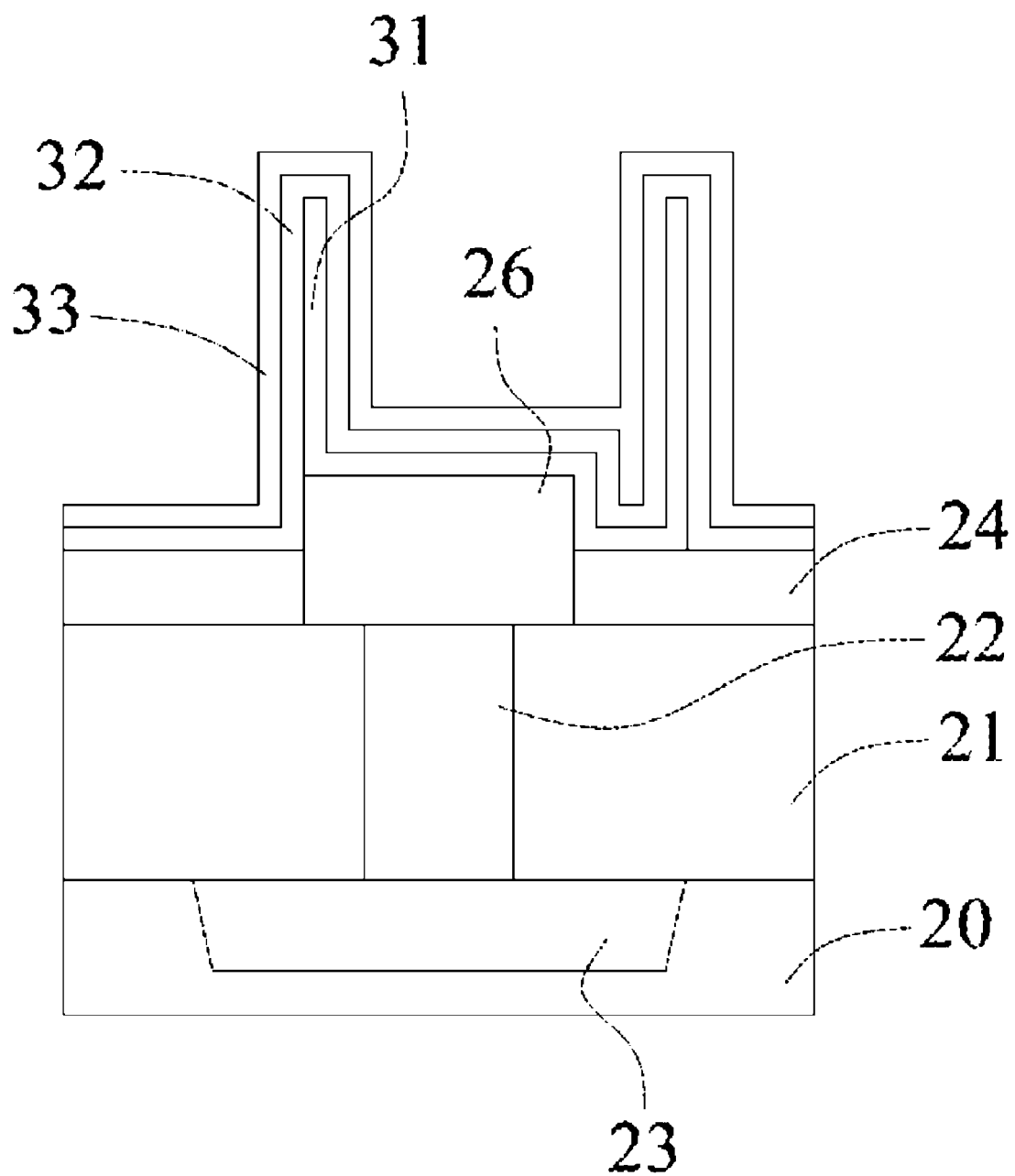
FIG. 11 is a cross-sectional diagram showing a tenth step of a method for forming a capacitor in a dynamic random access memory according to the present invention.

FIG. 11 is a cross-sectional diagram showing a tenth step of a method for forming a capacitor in a dynamic random access memory according to the present invention. In FIG. 11, a dielectric layer 32 and a second electrode layer 33 are deposited to complete a capacitor in a DRAM. The dielectric layer 32 is formed of high-k materials such as $HfO_2$, $Ta_2O_5$, $ZrO_2$, $TiO_2$, $Al_2O_3$, $SiO_2$ or a stack thereof by physical vapor-phase deposition (PVD) or chemical vapor-phase deposition (CVD). The second electrode layer 33 is formed of high work function materials such as TiN, Ru, TaN, Si, Pt or combination thereof by physical vapor-phase deposition (PVD) or chemical vapor-phase deposition (CVD).

According to the above discussion, it is apparent that the present invention discloses a method for forming a capacitor in a dynamic random access memory by deviating the embedded position of the capacitor so as to lengthen the distance between a sidewall portion of the mold cavity and a plug to further increase the mechanical strength of the capacitor and avoid short circuit. Therefore, the present invention is novel, useful and non-obvious.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A method for forming a capacitor in a dynamic random access memory (DRAM), comprising steps of:
   providing a semiconductor substrate having at least a transistor, whereon an interlayer dielectric layer having at least a first plug is formed so that the first plug is connected to a drain of the transistor;
   depositing an etching stop layer on the first plug and the interlayer dielectric layer;
   depositing a first insulating layer on the etching stop layer;
   forming at least a second plug on the first insulating layer and the etching stop layer so that the second plug is connected to the first plug;
   depositing a second insulating layer on the first insulating layer and the second plug;
   forming at least a mold cavity in the second insulating layer so that an aperture of the mold cavity is larger than the diameter of the second plug and there is a deviation between the mold cavity and the second plug; removing the first insulating layer in the mold cavity until the etching stop layer;
   depositing a first electrode layer to cover the second insulating layer, a sidewall portion of the mold cavity, the second plug and the etching stop layer;
   removing the second insulating layer so that the first electrode layer forms a single open-ended cavity; and
   depositing a dielectric layer and a second electrode layer over the semiconductor substrate to complete a capacitor in a DRAM.

2. The method for forming a capacitor in a dynamic random access memory as recited in claim 1, wherein the step for forming at least a second plug comprises:
   forming an aperture in the first insulating layer and the etching stop layer by photo-lithography and etching; and
   depositing a conductive material to fill in the aperture and planarizing the conductive material.

3. The method for forming a capacitor in a dynamic random access memory as recited in claim 2, wherein the conductive material is tungsten.

4. The method for forming a capacitor in a dynamic random access memory as recited in claim 1, wherein the first plug is formed of tungsten.

5. The method for forming a capacitor in a dynamic random access memory as recited in claim 1, wherein the deviation is half of the width of the mold cavity.

6. The method for forming a capacitor in a dynamic random access memory as recited in claim 1, wherein the first electrode layer is formed of TiN, Ru, TaN, Si, Pt or combination thereof.

7. The method for forming a capacitor in a dynamic random access memory as recited in claim 1, wherein the first electrode layer is formed by physical vapor-phase deposition (PVD) or chemical vapor-phase deposition (CVD).

8. The method for forming a capacitor in a dynamic random access memory as recited in claim 1, wherein the dielectric layer is formed of one of formed of $HfO_2$, $Ta_2O_5$, $ZrO_2$, $TiO_2$, $Al_2O_3$, $SiO_2$ or a stack thereof.

9. The method for forming a capacitor in a dynamic random access memory as recited in claim 8, wherein the dielectric layer is formed by physical vapor-phase deposition (PVD) or chemical vapor-phase deposition (CVD).

10. The method for forming a capacitor in a dynamic random access memory as recited in claim 1, wherein the second electrode layer is formed of TiN, Ru, TaN, Si, Pt or combination thereof.

11. The method for forming a capacitor in a dynamic random access memory as recited in claim 10, wherein the second electrode layer is formed by physical vapor-phase deposition (PVD) or chemical vapor-phase deposition (CVD).

* * * * *